(12) United States Patent
Sweet et al.

(10) Patent No.: US 12,207,428 B2
(45) Date of Patent: Jan. 21, 2025

(54) EXPANDABLE ELECTRICAL DISTRIBUTION SKID

(71) Applicant: Modular Power Solutions, Inc., San Jose, CA (US)

(72) Inventors: Michael Thomas Sweet, McKinney, TX (US); Justin McDonald, Clay Center, KS (US); Simon Harkins, Prosper, TX (US)

(73) Assignee: Modular Power Solutions, Inc., San Jose, CA (US)

( * ) Notice: Subject to any disclaimer, the term of this patent is extended or adjusted under 35 U.S.C. 154(b) by 749 days.

(21) Appl. No.: 17/189,694

(22) Filed: Mar. 2, 2021

(65) Prior Publication Data
US 2021/0274672 A1    Sep. 2, 2021

Related U.S. Application Data

(60) Provisional application No. 62/984,097, filed on Mar. 2, 2020.

(51) Int. Cl.
*H01F 7/06* (2006.01)
*F16M 11/22* (2006.01)
*H05K 7/02* (2006.01)

(52) U.S. Cl.
CPC ............. *H05K 7/026* (2013.01); *F16M 11/22* (2013.01); *F16M 2200/08* (2013.01)

(58) Field of Classification Search
CPC ........ H02B 1/303; H02B 1/308; H05K 7/026; F16M 11/22; F16M 2200/08
See application file for complete search history.

(56) References Cited

U.S. PATENT DOCUMENTS 9,192,069 B2 * 11/2015 Emert .................... H05K 7/026
10,568,231 B1 * 2/2020 Metcalf ................ H05K 7/1489

* cited by examiner

*Primary Examiner* — Paul D Kim
(74) *Attorney, Agent, or Firm* — Rutan and Tucker, LLP

(57) ABSTRACT

An expandable electrical distribution skid can be manufactured as a monolithic, pre-wired, pre-engineered, and pre-assembled integrated platform to provide a critical power supply and distribute electrical power distribution, which can expand from a collapsed state to an expanded state, and vice versa. The expandable electrical distribution skid can be manufactured as a monolithic, pre-wired, pre-engineered, and pre-assembled integrated platform, where the frame is broken up into multiple segments. The different segments of framework for the expandable electrical distribution skid are coupled to connect to a common expansion track in order to move one or more of the segments at least one of i) inward to collapse and ii) outward to expand.

17 Claims, 6 Drawing Sheets

EXPANDABLE ELECTRICAL DISTRIBUTION SKID

RELATED APPLICATION

This application claims priority to and the benefit of under 35 USC 119 of U.S. provisional patent application titled "AN EXPANDABLE ELECTRICAL DISTRIBUTION SKID," filed Mar. 2, 2020, Ser. No. 62/984,097, which is incorporated herein by reference in its entirety.

FIELD OF THE INVENTION

Embodiments of the invention generally relate to an expandable electrical distribution skid.

BACKGROUND OF THE INVENTION

Construction projects proceed in stages because certain aspects of the project must be completed prior to the next stage being initiated. However, the traditional stages of constructing a building can be altered with some creative thinking.

SUMMARY

In an embodiment, an expandable electrical distribution skid can be manufactured. The expandable electrical distribution skid can be manufactured as a monolithic, pre-wired, pre-engineered, and pre-assembled integrated platform to provide a critical power supply and distribute electrical power distribution, which can expand from a collapsed state to an expanded state, and vice versa. The expandable electrical distribution skid can be manufactured as a monolithic, pre-wired, pre-engineered, and pre-assembled integrated platform, where the frame is broken up into multiple segments. The different segments of framework for the expandable electrical distribution skid are coupled to connect to a common expansion track in order to move one or more of the segments at least one of i) inward to collapse and ii) outward to expand.

BRIEF DESCRIPTION OF THE DRAWINGS

The drawings refer to embodiments of the invention in which include many numbered and unnumbered figures that accompany the descriptions herein.

Figure 1:
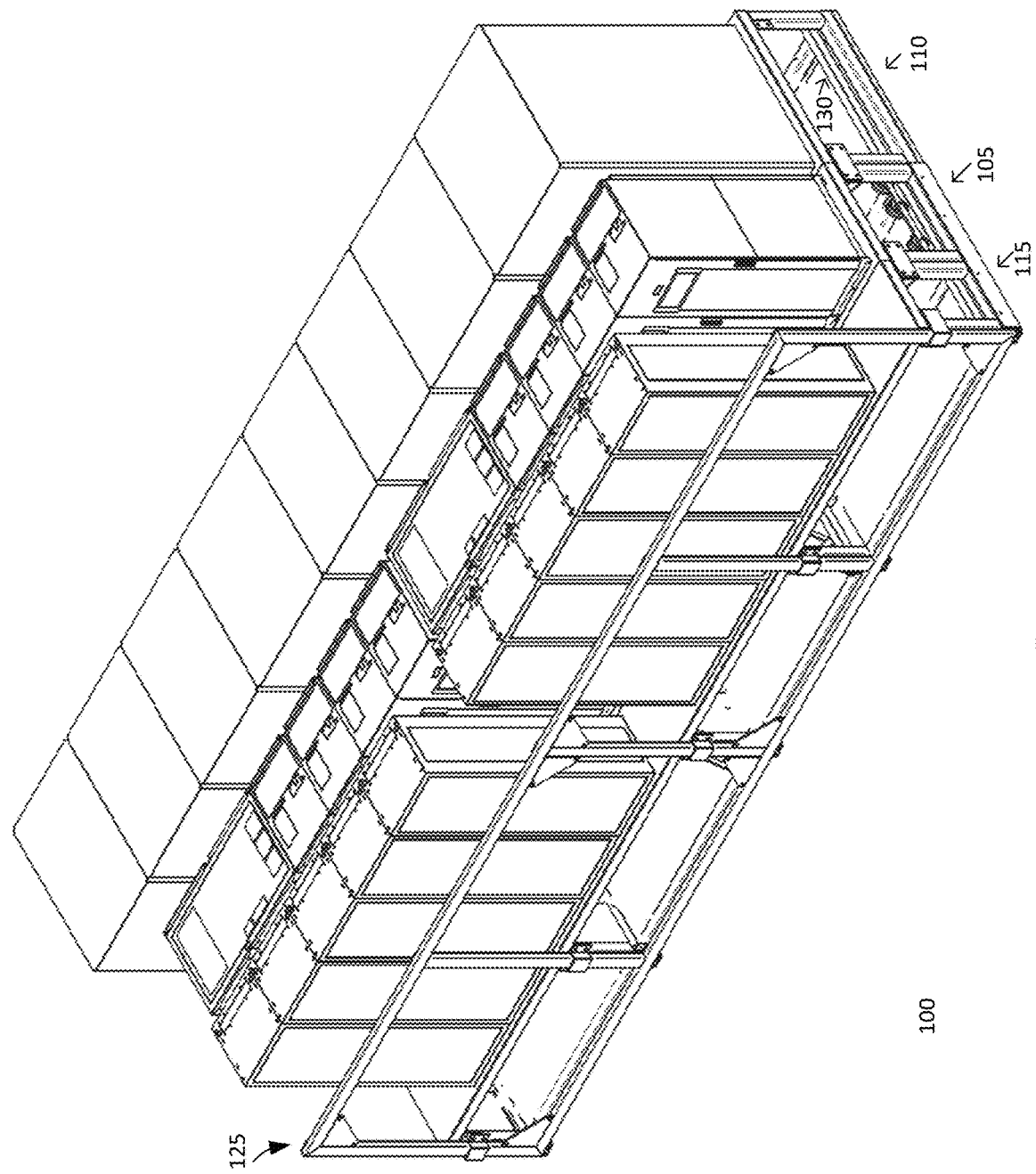
FIG. 1 illustrates an example embodiment of a side perspective view of the expandable electrical distribution skid in a collapsed state.

While the invention is subject to various modifications and alternative forms, specific embodiments thereof have been shown by way of example in the drawings and will herein be described in detail. The invention should be understood to not be limited to the particular forms disclosed, but on the contrary, the intention is to cover all modifications, equivalents, and alternatives falling within the spirit and scope of the invention.

DETAILED DISCUSSION

In the following description, numerous specific details are set forth, such as examples of specific data signals, named components, connections, amount of power supplies, etc., in order to provide a thorough understanding of the present invention. It will be apparent, however, to one of ordinary skill in the art that the present invention may be practiced without these specific details. In other instances, well known components or methods have not been described in detail but rather in a block diagram in order to avoid unnecessarily obscuring the present invention. Further specific numeric references such as first enclosure, may be made. However, the specific numeric reference should not be interpreted as a literal sequential order but rather interpreted that the first enclosure is different than a second enclosure. Thus, the specific details set forth are merely exemplary. The specific details may be varied from and still be contemplated to be within the spirit and scope of the present invention.

FIG. 1 illustrates an example embodiment of a side perspective view of the expandable electrical distribution skid in a collapsed state.

A monolithic, pre-wired, pre-engineered, and pre-assembled integrated platform for a critical power supply and electrical distribution system that is scalable and modular is described. The integrated platform has a skeletal framework that acts as an equipment support structure. Two or more cabinet enclosures are mounted onto the framework where their weight is supported by the skeletal framework. One or more National Electric Code (NEC) approved electrical cable routing systems are in a raised floor section formed by the framework or in cable trays or other cable routing systems mounted onto an upper superstructure above the mounted cabinet enclosures. The skeletal framework and the cabinet enclosures are fabricated in place as a monolithic, pre-wired, pre-engineered, and pre-assembled, and tested integrated platform prior to being installed. The skeletal framework supporting the weight of the cabinets and cable routing support systems is configured to allow the integrated platform including its mounted cabinets to be installed into a building site as a monolithic, pre-wired, and pre-assembled integrated platform.

A frame of the expandable electrical distribution skid 100 is broken up into multiple segments 105, 110, 115. In this example embodiment, the frame is broken up into three segments: the center segment 105 of the framework, the second segment 110 of the framework on a first side of the center segment 105 of the framework, the third segment 115 of the framework on a second side of the center segment 105 of the framework. The center segment 105 of the framework generally contains the uninterruptible power supplies (UPSs) and other electrical equipment that reside electrically between the power source of the batteries and the electrical distribution cabinets containing the circuit breakers for their corresponding electrical loads. The uninterruptible power supplies are mounted onto the center segment 105 of the framework of the skid. The electrical cabling going from each of the UPSs to other cabinets mounted on the other segments 105, 110, 115 of the framework of the skid is installed in the factory before being shipped to a work site. The electrical cabling connected up to the other cabinets mounted on the other segments 105, 110, 115 of the framework of the skid is installed in the factory before being shipped to the work site. The uninterruptible power supplies (UPSs) being mounted onto the center segment 105 of the framework helps minimize a distance the installed cables need to stretch because in general most of the cabling (electrical power carrying cables as well as control signaling cables) needs to merely stretch between a center segment 105 and a neighboring segment; rather than, stretch across an entire width of the skid from an end segment to the opposite side's end segment.

Batteries and various control cabinets can be mounted and assembled onto the second segment 110 of the framework on a first side of the center segment 105 of the framework of the skid in the factory. Electrical distribution cabinets with their circuit breakers and/or other switch gear, can be mounted and assembled onto the third segment 115 of the framework on a second side of the center segment 105 of the framework of the skid in the factory.

Each segment of the framework contains and supports the weight of the batteries and/or electrical cabinets mounted on that segment of the expandable electrical distribution skid 100. The third segment 115 of the framework contains at least two sections i) a horizontal platform with a floor that supports the weight of the batteries and a second section that is foldable downward. The foldable framework section 125 is hinged to a framework of the first section with the horizontal platform. Note, the foldable section 125 can be attached and hinged to either the second segment 110 of the framework on the first side that supports the electrical distribution cabinets or the third segment 115 of the framework on the second side.

In the example in the figure, the foldable framework section 125 connects with the hinge to the second segment 110 of the framework on a first side of the center segment 105 of the framework of the skid, which supports the batteries. The foldable section 125 has at least two purposes provided by the D loops (five D loops in this example) mounted on a strut (five D struts in this example) of the foldable section. The first purpose is the D loops maintain a positive mechanical restraint between the foldable section and the rest of the expandable electrical distribution skid 100, in order to hold the skid in a collapsed state during shipping to the site as well as when the skid is being rigged into place in an electrical room of a building while at the construction site. The second purpose is once rigged into place in the electrical room at the site, then a winch can hook up to the D loops and their bolt holes to connect to the expansion track 130 in order to expand or collapse the distance between the different segments 105, 110, 115 of the framework. The different segments 105, 110, 115 of the framework all connect to a common expansion track 130 to roll or otherwise move the segments 105, 110, 115 i) inward to collapse or ii) outward to expand. The common expansion track 130 of the expandable framework sections may use a roller track, a telescoping mechanism, or other similar mechanical expansion contraction mechanism in order to expand the width of the expandable electrical distribution skid 100.

Again, the width of the skid capable of being in a collapsible state allows one to rig the electrical distribution skid 100 to a final destination/location within a building, put the skid into its final location, anchor the skid on one side, and then expand the width of the skid once inside the electrical room where it's going to be installed.

Next, a length of cabling between different segments 105, 110, 115 of the framework can be expanded and contracted. The cabling between the electrical equipment on the different segments 105, 110, 115 of the framework is fully connected, installed, and tested at the manufacturing facility prior to this integrated skid being shipped to the work site. The collapsible stage allows multiple segments 105, 110, 115 in multiple different cabinet types to be all hooked together, i) mechanically through the framework and ii) electrically via the cabling electrically being connected, and tested in the factory eliminating having a hook up substantially of all of those electric connections and test them in the field.

The skid uses a mechanism to allow for cable expansion and contraction between the wired up cabinets in the factory, a mechanical mechanism to expand the frame, and then ensure that the cable clearances meet i) National Electrical Code requirements, ii) any customer requirements, iii) physical requirements to not get pinched or tangled themselves, as well as iv) physical requirements to not interfere or get tangled in the framework when the frame segments 105, 110, 115 separate and contract in their expanded state and collapsed state.

The cabling expands outward from the UPS cabinets to neighboring cabinets on its left side or right side using the cable expansion mechanism. The cable expansion mechanism may be implemented by routing the cabling in one or more U-shaped lengths between cabinets mounted on each of these sections of the framework when the framework expands from the collapsed state over to the expanded state. When the framework expands from the collapsed state over to the expanded state, then the cabling in the U-shaped lengths lengthens and becomes more of a straight line cable by being pulled tauter by the expansion of the segmented framework. The cabling expansion mechanism may also be routing and supporting the cabling in one or more oval shaped loops so that when the segmented framework expands from the collapsed state over to the expanded state, then the cabling in the oval shape is pulled more taunt to decrease the diameter of the oval.

Importantly, the expandable electrical distribution skid 100 has a segmented framework that can be secured and held together in its narrowest width collapsed state, during the shipping process to get the skid to the worksite, as well as during the crane lifting rigging installation process. A set of D loops and securing plates can be used to hold the segments 105, 110, 115 of the framework in its collapsed state. Note, the segments 105, 110, 115 of the framework cooperate with the common expansion track 130 of the expandable framework sections to allow the multiple different segments 105, 110, 115 of the frame to more easily expand and move apart when not being positively restrained from expanding.

Once rigged and installed into the building, then each segment of the segmented framework can be separated from the other segments 105, 110, 115 through the track or telescoping expansion mechanism. The D loops and rectangular securing plates can be removed in order to allow the framework to expand from its secured collapsed state. The rectangular securing plates with the bolt holes allows the multiple movable segments 105, 110, 115 of the expandable frame to be bolted together during shipping and rigging in order to keep the movable segments 105, 110, 115 of the framework, which are designed to easily slide apart, positively bolted together during the installations and shipping process in order to maintain the collapsed state of the framework.

The foldable track portion shows triangular angle plates used in each of its corners of the outside struts as well as in the corners of the middle strut. Those triangular angle plates are welded to the framework. The triangular angle plates help maintain the shape of the framework and the strength of framework as well as have holes for bolting the framework to an anchor in the foundation of the building.

There will be at least three common expansion tracks 130 (one on each side and at least one in the middle) to slide the segments 105, 110, 115 of the framework apart along those tracks when an expansion track 130 system is used. Roller wheels are mounted to the framework and a low friction material coats the sliding surfaces of the track for the frame segments 105, 110, 115 to move on. The low friction material coats the sliding surfaces can be a durable plastic like Ultra High Molecular Weight Polyethylene (UHMW) frictionless material. The low friction material coats the sliding surfaces to provide wide sliding surfaces to help spread the weight of the framework and cabinets in each wide expansion track 130 as well as across the multiple expansion tracks 130 forming the sliding surface. Note, the roller wheels and expansion tracks 130 also guide the expansion of the framework sections to ensure the pre-installed cabling between the different segments 105, 110, 115 of the framework do not get entangled when expanding and contracting the width of the electrical distribution skid 100. The wheels act as rollers to guide the expansion of the segments 105, 110, 115 along the known pathway of the framework away from each other.

The securing plates on the side of the framework have multiple functions.

The securing plates have a series of bolt holes that allows securing two or more segments 105, 110, 115 of the framework together when shipping or rigging in place in the skid's collapsed state. The securing plates have a series of bolt holes that allows securing two or more segments 105, 110, 115 of the framework when secured in place in the skid's expanded state. The securing plates when secured in place in this second position lock rigidity into the framework in the skid's expanded state.

The series of bolt holes on the framework, for each of those segments 105, 110, 115, correspond positionally on the frame to when the skid is in its collapsed state. Another series of bolt holes in the segments 105, 110, 115 of the framework correspond to a second position of the bolt holes for connection to the securing plate when the framework is in its expanded state. The securing plates with the second position of the bolt holes lock rigidity into the framework in the skid's expanded state.

Figure 2:
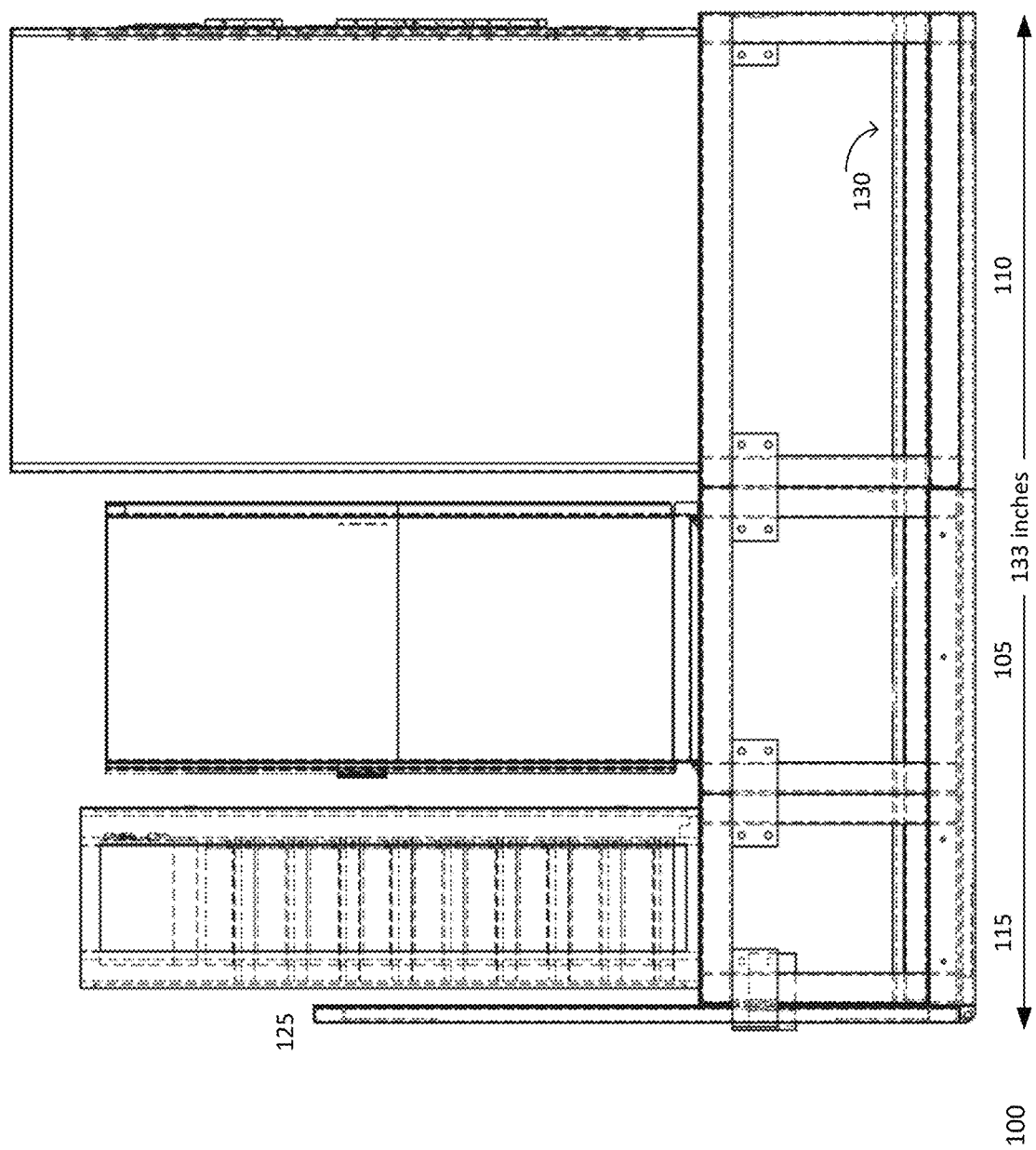
FIG. 2 illustrates an example embodiment of a front view of the expandable electrical distribution skid.

FIG. 2 illustrates an example embodiment of a front view of the expandable electrical distribution skid. Each of the segments 105, 110, 115 of the framework can be clearly seen via the vertical dotted lines on the bottom rectangular framework sections. The securing plates with their bolt holes securing one set of framework to another segment of framework can be seen. The bolt holes in the securing plates match up to bolt holes in the segments 105, 110, 115 of the framework to lock the skid in its collapsed state. Also, the common expansion tracks 130 for expanding the multiple segments 105, 110, 115 of the framework can be seen near the bottom of the skid. Also, the second set of bolt holes in the framework for the securing plate into its expanded state can be seen on the left-hand side near the bottom. Note, the expandable electrical distribution skid 100 can expand from a width of, for example, 11½ feet in a collapsed state expanded out to, for example, 15 feet total width in its expanded state.

Figure 3:
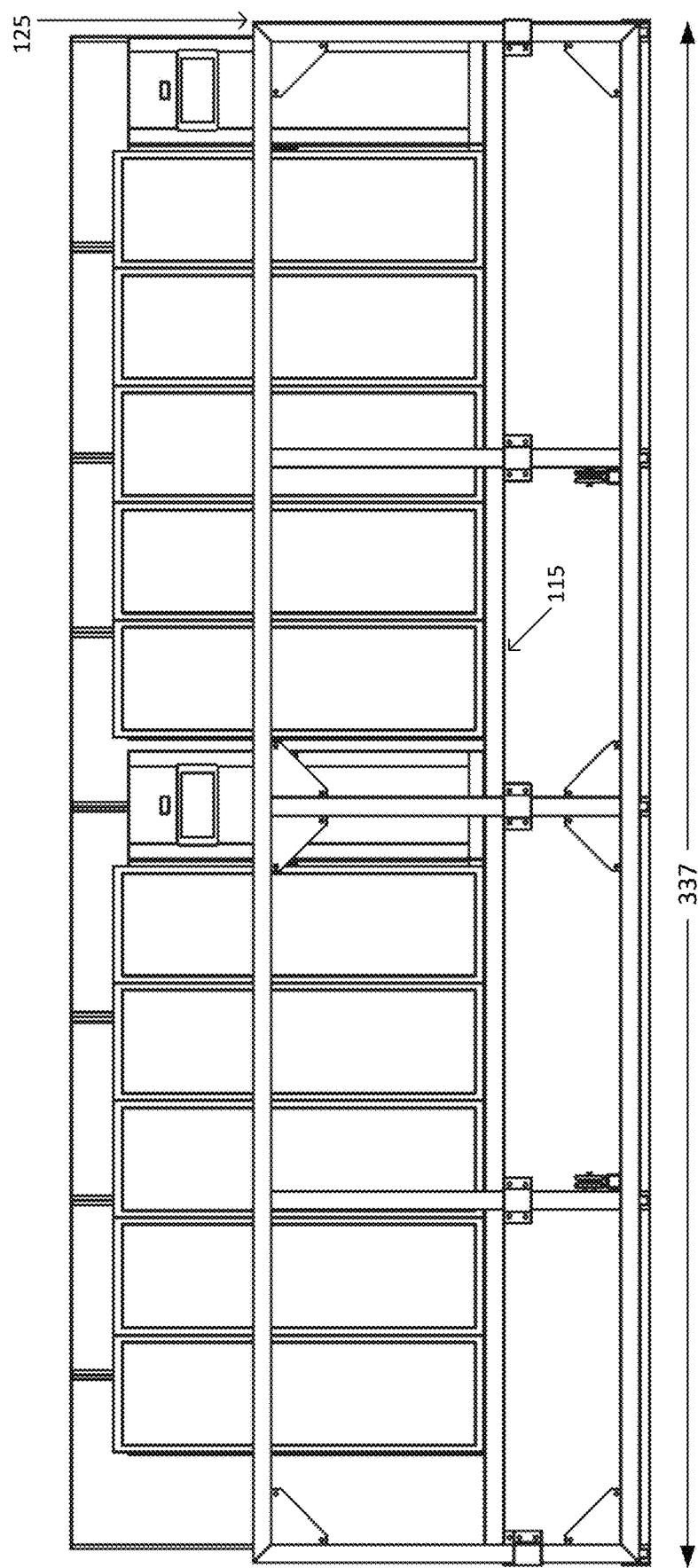
FIG. 3 illustrates an example embodiment of a left side view of the expandable electrical distribution skid.

FIG. 3 illustrates an example embodiment of a left side view of the expandable electrical distribution skid. In this view, the foldable framework 125 is clearly visible with the distribution cabinets behind and the battery cabinets behind the foldable section. In addition, near the bottom of the skid, the wheels can be seen as well as the common expansion track 130 below the triangular angle plates. Next, the D loops and angle plates for support and anchoring can also be seen. Also can be seen are the D loops for rigging, shipping, and once installed in place, then providing a location to secure a positive connection to a framework section in order to grab and hold the segments 105, 110, 115 to expand and pull apart the different framework sections on their rolling tracks with a winch.

Figure 4:
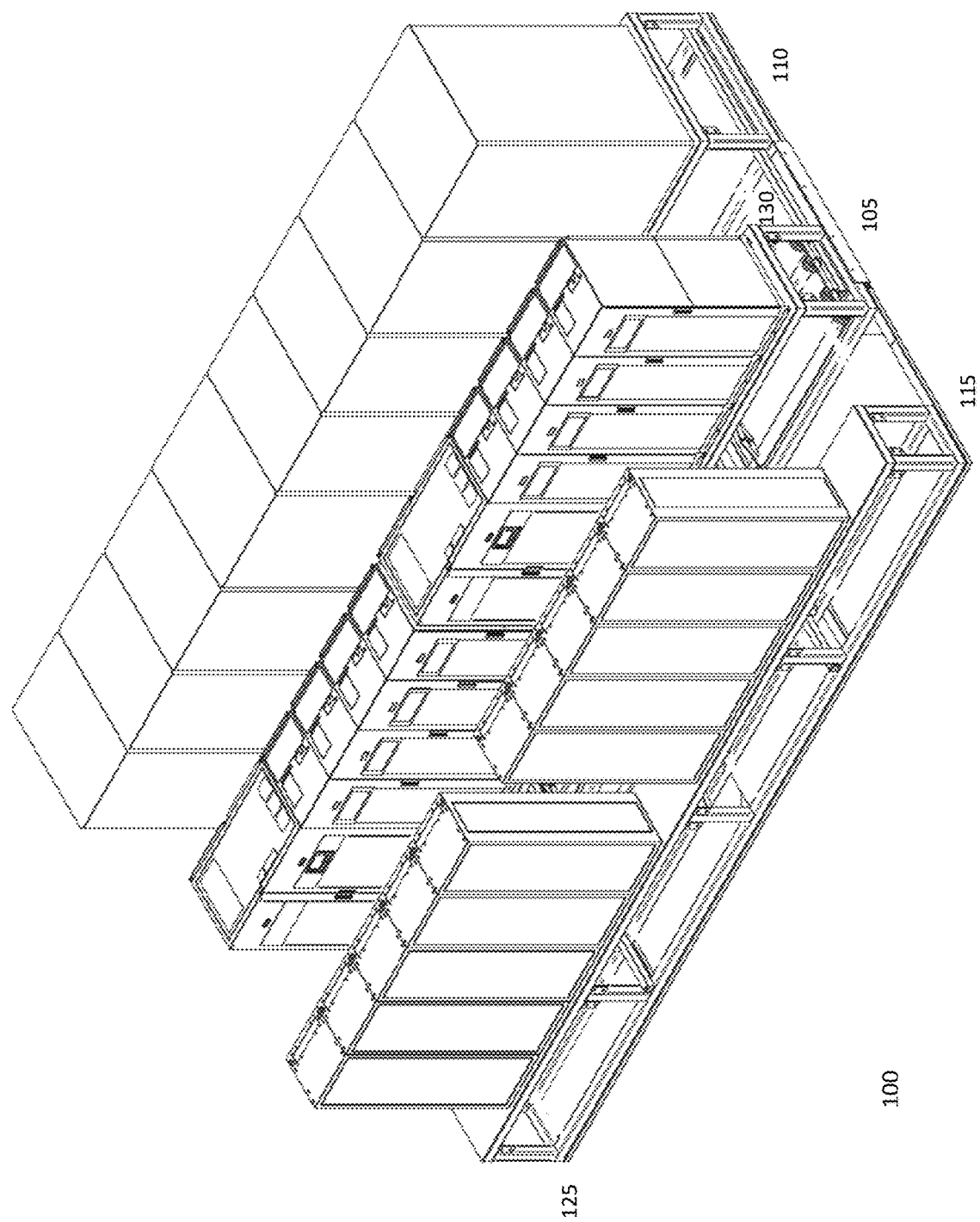
FIG. 4 illustrates an example embodiment of the expandable electrical distribution skid in its expanded state.

FIG. 4 illustrates an example embodiment of the expandable electrical distribution skid in its expanded state. The foldable framework 125 is folded down; and thus, laying on the ground. The horizontal floor portion of that section framework is expanded along the track to the edge of the folded down portion to place the distribution skid 100 into its expanded state. The expansion tracks 130 can be seen in the middle in the edges of the framework on the bottom as well as the roller wheels can be seen under the middle segment.

Next, the expansion process can, for example, go as follows. Once the expandable electrical distribution skid 100 is rigged and placed into its final destination by cranes and/or other means, then the skid can be anchored and expanded. First, the securing plates and D loops can be unsecured to allow the segments 105, 110, 115 of the framework to be now in a state where they can be pulled apart. Next, the segment of the framework with the electrical distribution cabinets is anchored, via bolts, through the framework and its triangular angle brackets to the anchors in the foundation, then the foldable segment maybe loosened and hinged downward. Once the folded segment is folded downward onto the surface, then the foldable section can be anchored to the foundation through its triangular angle plates. After anchoring, the winch can pull the segment of the framework with the batteries out and over the foldable segment of the framework.

Once fully expanded, then the bottom securing plates can be bolted to the different segments 105, 110, 115 of the framework into its second set of corresponding bolt holes to lock and secure the expandable electrical distribution skid 100 and its expanded state.

Figure 5:
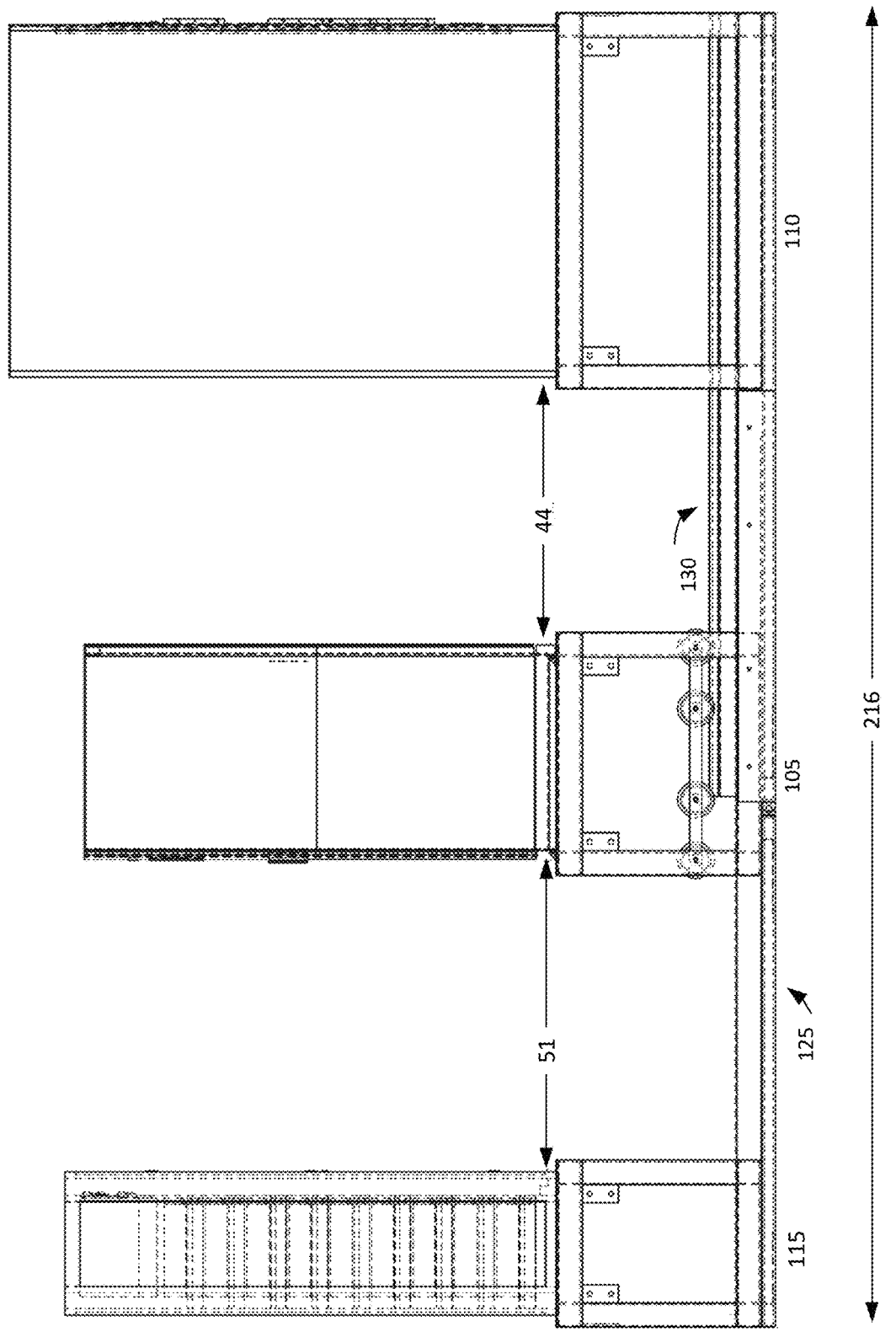
FIG. 5 illustrates an example embodiment of a front perspective of the expandable electrical distribution skid in its expanded state.

FIG. 5 illustrates an example embodiment of a front perspective of the expandable electrical distribution skid in its expanded state.

The horizontal gaps between segments 105, 110, 115 of the framework can have flooring laid over or into those gaps to create the raised floor area below the cabinets. The cabling connected in the factory between the different cabinets can be routed in this raised floor area. In an embodiment, the cabling running to the cabinets mounted on the skid from the UPS cabinets to the batteries can be routed overhead with an overhead electrical tray system that uses a telescoping tray or other expansion mechanism to expand when the segments 105, 110, 115 of the framework with the cabinets below expand.

Figure 6:
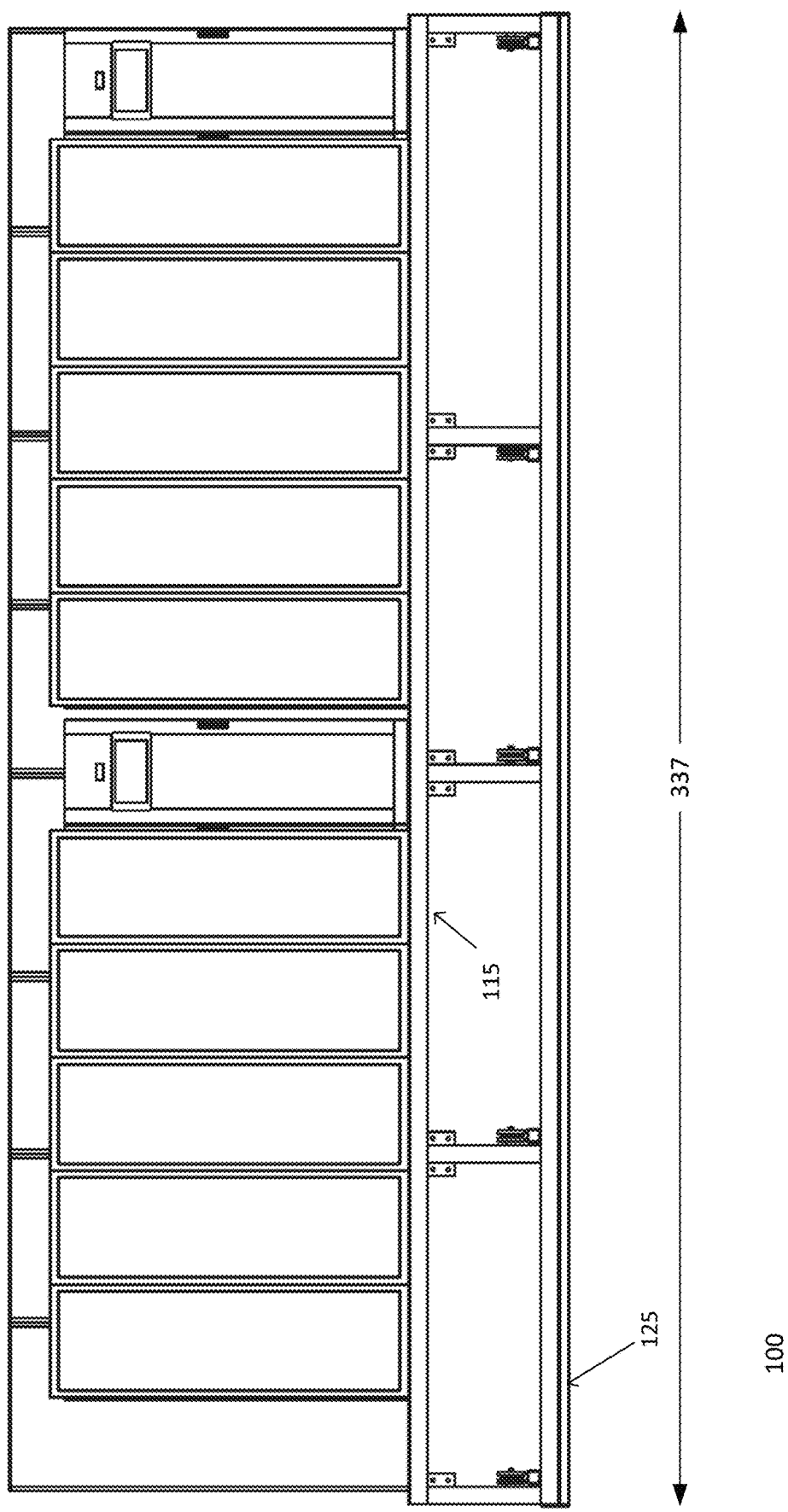
FIG. 6 illustrates an example embodiment of the foldable section fully folded down onto the ground, followed upward by the framework making up the raised floor portion of the skid, followed by the cabinets mounted on the horizontal flooring segments of the framework.

FIG. 6 illustrates an example embodiment of the foldable section fully folded down onto the ground, followed upward by the framework making up the raised floor portion of the skid, followed by the cabinets mounted on the horizontal flooring segments 105, 110, 115 of the framework. Also, the roller wheels and common expansion track 130 can be seen.

Note, the width of the foldable section maybe varied in length to create instances of the expandable electrical distribution skid 100 with different widths. A longer length of foldable section may be hinged to the framework, which subsequently makes a wider skid when expanded into its expanded state. A shorter length of foldable section may be hinged to the framework, which subsequently makes a slightly less wide skid when expanded into its expanded state.

Again, the cabinet enclosures can mount to holes in the framework where the cabinet enclosures sit on the horizontal flooring. All of these components are mounted on a steel support frame that is pre-assembled in an offsite manufacturing center.

In an embodiment, a main switchboard cabinet on the framework can have one or more electrical connections, including a first electrical connection and an associated circuit breaker to receive power cables coming from a main generator, acting as the backup AC power source, and a second electrical connection and associated circuit breaker coming from a step down transformer connected to power lines of the utility electrical power grid.

The power from the utility power grid comes in through a main step down transformer. Power from a utility power grid comes in through a main step down transformer via one or more circuit breakers in a main switchboard cabinet to power mechanical cooling power loads for a datacenter and via additional circuit breakers to supply power through the main and backup UPSs. The main and backup UPSs' supply critical power to computer equipment power distribution loads for the datacenter via further circuit breakers in the power distribution output panel.

While some specific embodiments of the invention have been shown, the invention is not to be limited to these embodiments. For example, most functions performed by electronic hardware components may be duplicated by software emulation. Thus, a software program written to accomplish those same functions may emulate the functionality of the hardware components in input-output circuitry. The type of cabinets may vary, etc. The invention is to be understood as not limited by the specific embodiments described herein, but only by scope of the appended claims.

We claim:

1. A method for manufacturing an expandable electrical distribution skid, comprising:
   manufacturing the expandable electrical distribution skid as the monolithic, pre-wired and pre-assembled integrated platform that includes a power supply and distributes electrical power, the integrated platform includes a frame is broken up into a plurality of segments that can be collectively (i) expanded from a collapsed state to an expanded state and (ii) returned from the expanded state to the collapsed state; and
   coupling the plurality of segments of the frame for the expandable electrical distribution skid to connect to a common expansion track in order to move at least one segment of the plurality of segments at least one of i) inward to place the electrical distribution skid into the collapsed state and ii) outward to place the electrical distribution skid into the expanded state.

2. The method of claim 1, wherein the plurality of segment of the frame includes a first segment interposed between a second segment and a third segment, one or more uninterruptible power supplies being mounted on the first segment of the frame.

3. The method of claim 2, wherein a plurality of batteries are mounted and assembled on the second segment of the frame, the plurality of batteries are electrically coupled to the one or more uninterruptible power supplies.

4. The method of claim 3, wherein one or more electrical distribution cabinets each containing one or more circuit breakers is mounted and assembled on the third segment of the frame, the one or more circuit breakers are electrically coupled to the one or more uninterruptible power supplies.

5. The method of claim 4, wherein a first cabling between the one or more uninterruptible power supplies and the plurality of batteries and a second cabling between the one or more uninterruptible power supplies and the one or more electrical distribution cabinets are factory installed prior to shipping to a customer.

6. The method of claim 1, further comprising:
   coating sliding surfaces of the expansion track with a low-friction material and mounting wheels onto at least a first segment positioned within the expansion track.

7. The method of claim 4 further comprising:
   placing the expandable electrical distribution skid into the collapsed state by at least coupling together the plurality of segments in which at least the third segment includes a first section to support a weight of the one or more electrical distribution cabinets and a second section that is foldable downward and attached to the first segment of the frame.

8. The method of claim 7 further comprising:
   placing the expandable electrical distribution skid into the expanded state by at least removing security plates and bolts inserted through the security plates extending for attachment to at least the second section of the first segment.

9. An expandable electrical distribution skid being a monolithic, pre-wired and pre-assembled integrated platform that includes a power supply and distributes electrical power, comprising:
   an expansion track; and
   a framework that includes a plurality of segments including a first segment, a second segment, and a third segment, wherein the framework is coupled to the expansion track and is configured to move at least one segment of the plurality of segments at least one of i) inward to place the electrical distribution skid into the collapsed state and ii) outward to place the electrical distribution skid into the expanded state.

10. The expandable electrical distribution skid of claim 9, wherein the plurality of segment of the framework includes the first segment interposed between the second segment and the third segment, one or more uninterruptible power supplies corresponding to the power supply being mounted on the first segment of the framework.

11. The expandable electrical distribution skid of claim 10, wherein a plurality of batteries are mounted and assembled on the second segment of the framework, the plurality of batteries are electrically coupled to the one or more uninterruptible power supplies.

12. The expandable electrical distribution skid of claim 11, wherein one or more electrical distribution cabinets each containing one or more circuit breakers is mounted and assembled on the third segment of the framework, the one or more circuit breakers are electrically coupled to the one or more uninterruptible power supplies.

13. The expandable electrical distribution skid of claim 12, wherein a first cabling between the one or more uninterruptible power supplies and the plurality of batteries and a second cabling between the one or more uninterruptible power supplies and the one or more electrical distribution cabinets are factory installed prior to shipping to a customer.

14. The expandable electrical distribution skid of claim 9, wherein sliding surfaces of the expansion track are coated with a low-friction material and wheels are mounted onto at least a first segment positioned within the expansion track.

15. The expandable electrical distribution skid of claim 12, wherein the third segment of the framework includes a first section to support a weight of the one or more electrical distribution cabinets and a second section that is foldable downward and attached to the first segment of the framework.

16. The expandable electrical distribution skid of claim 9, wherein a distance of separation between the first segment and the second segment when the expandable electrical distribution skid is placed into the collapsed state is less than a distance of separation between the first segment and the second segment when the expandable electrical distribution skid is placed into the expanded state.

17. The expandable electrical distribution skid of claim 16, wherein a distance of separation between the first segment and the third segment when the expandable electrical distribution skid is placed into the collapsed state is less than a distance of separation between the first segment and the third segment when the expandable electrical distribution skid is placed into the expanded state.

* * * * *